United States Patent
Gondcharton et al.

(10) Patent No.: US 10,403,597 B2
(45) Date of Patent: Sep. 3, 2019

(54) DIRECT BONDING METHOD

(71) Applicant: COMMISSARIAT A L'ENERGIE ATOMIQUE ET AUX ENERGIES ALTERNATIVES, Paris (FR)

(72) Inventors: Paul Gondcharton, Grenoble (FR); Lamine Benaissa, Massy (FR); Bruno Imbert, Grenoble (FR); Guillaume Rodriguez, Le Champ Pres Froges (FR); Chiara Sabbione, Asti (IT)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 73 days.

(21) Appl. No.: 15/747,246

(22) PCT Filed: Jun. 29, 2016

(86) PCT No.: PCT/FR2016/051621
§ 371 (c)(1),
(2) Date: Jan. 24, 2018

(87) PCT Pub. No.: WO2017/017325
PCT Pub. Date: Feb. 2, 2017

(65) Prior Publication Data
US 2018/0218999 A1      Aug. 2, 2018

(30) Foreign Application Priority Data

Jul. 24, 2015  (FR) ..................................... 15 57117

(51) Int. Cl.
*H01L 23/00*     (2006.01)
*B81C 3/00*      (2006.01)
(Continued)

(52) U.S. Cl.
CPC .............. *H01L 24/83* (2013.01); *B81C 3/001* (2013.01); *H01L 21/02002* (2013.01);
(Continued)

(58) Field of Classification Search
CPC ....... H01L 2224/2745; H01L 21/02266; H01L 2224/80894; H01L 2224/81894;
(Continued)

(56) References Cited

U.S. PATENT DOCUMENTS

| | | | |
|---|---|---|---|
| 10,020,283 B2 * | 7/2018 | Baudin | H01L 21/187 |
| 2008/0041517 A1 * | 2/2008 | Moriceau | H01L 24/83 |
| | | | 156/182 |

(Continued)

FOREIGN PATENT DOCUMENTS

| | | |
|---|---|---|
| FR | 3022562 A1 | 12/2015 |
| WO | 2014/195621 A1 | 12/2014 |

OTHER PUBLICATIONS

Vertical Metal Interconnect Thanks to Tungsten Direct Bonding Léa Di Cioccioa, Pierric Gueguena, Etienne Grouillera, Laurent Vandrouxa, Vincent Delayea, Maurice Rivoireb, Jean François Lugandb, Laurent Claveliera. 2010 Electronic Composition and Technology conference (Year: 2010).*

(Continued)

*Primary Examiner* — William F Kraig
*Assistant Examiner* — Khatib A Rahman
(74) *Attorney, Agent, or Firm* — Oliff PLC

(57) ABSTRACT

A bonding between a first substrate and a second substrate, the method includes the steps of: a) providing the first substrate and the second substrate, b) forming a first bonding layer having tungsten oxide on the first substrate and a second bonding layer having tungsten oxide on the second substrate, at least one of the first bonding layer and of the second bonding layer including a third element M so as to (Continued)

form an MWxOy-type alloy, the atomic content of M in the composition of the alloy being between 0.5 and 20% and preferably between 1 and 10%, c) carrying out a direct bonding between the first bonding layer and the second bonding layer, and d) performing a heat treatment at a temperature greater than 250° C.

15 Claims, 2 Drawing Sheets

(51) Int. Cl.
  *H01L 21/20* (2006.01)
  *H01L 21/02* (2006.01)
(52) U.S. Cl.
  CPC .......... *H01L 21/2007* (2013.01); *H01L 24/27* (2013.01); *H01L 21/02194* (2013.01); *H01L 21/02266* (2013.01); *H01L 2224/2745* (2013.01); *H01L 2224/80894* (2013.01); *H01L 2924/0536* (2013.01)
(58) Field of Classification Search
  CPC . H01L 2224/82895; H01L 2224/83894; H01L 2224/84895; H01L 2224/85895; H01L 2224/86895
  See application file for complete search history.

(56) References Cited

U.S. PATENT DOCUMENTS

| | | | |
|---|---|---|---|
| 2011/0220205 A1* | 9/2011 | Jang | H01G 9/2031 136/263 |
| 2012/0241821 A1 | 9/2012 | Bethoux et al. | |
| 2014/0318947 A1* | 10/2014 | Parker | H01J 37/3414 204/192.12 |
| 2014/0323291 A1* | 10/2014 | Carati | B01J 23/002 502/167 |
| 2017/0213807 A1 | 7/2017 | Benaissa et al. | |

OTHER PUBLICATIONS

Oct. 10, 2016 International Search Report issued in International Patent Application No. PCT/FR2016/051621.
Oct. 10, 2016 Written Opinion issued in International Patent Application No. PCT/FR2016/051621.

* cited by examiner

DIRECT BONDING METHOD

The present invention concerns a direct bonding method between a first substrate and a second substrate and in particular an electrical conductor bonding method between bonding layers comprising tungsten and tungsten oxide.

The technique of the direct bonding is used in different fields of microelectronics: the 3D integration with high-density interconnections, the MEMS or NEMS (Micro or Nano Electrical Mechanical Systems) component packaging, or in the transfer of silicon components onto particular substrates such as metal bases, III-V substrates or substrates for the RF (Radio Frequency) applications.

Currently, two main integration approaches in the field of the 3D integration are known. In a first heterogeneous approach, the components are manufactured separately on two different substrates. The manufacturing comprises all the steps up to the last interconnection levels called back-end levels. The substrates are then assembled by direct bonding of the mixed surfaces of dielectric materials and metals ($SiO_2$/Cu). The main limitation of this approach is the necessary alignment during the bonding which must be less than 1 µm which is difficult to achieve on an industrial scale. Another limitation is that the copper resistivity increases significantly for the thin films and the fine interconnections. In the second sequential approach, a first substrate is prepared up to middle-end interconnection levels (tungsten plugs). A thin semiconductor layer is then transferred onto this substrate for example by Smart Cut™ or mechanical thinning of a second substrate. Components are then prepared in this transferred fine layer and may be aligned with those of the lower substrate with a lithographic accuracy of about 50 nm. Since the bonding method is carried out at the middle-end level, the direct bonding is advantageously carried out on thin tungsten layers, whose conductivity is greater than that of copper. These tungsten layers serve both as a mechanical and electrical link between the two active layers.

However, the direct bonding of thin tungsten layers constitutes a major technological challenge. Indeed, the management of the reaction products (following in particular a consolidation annealing after bonding) causes a very significant defectivity due to the nature itself of the chemical species brought into contact. The method being carried out in ambient air, there is formation of a native oxide on the metal layers involved. This native oxide is unstable with the provision of thermal budgets after bonding. Therefore, the bonding of this oxide phase does not ensure a quality assembly, the assembly has a low mechanical strength, a high defectivity and a low vertical electric conduction.

In order to remedy these problems, two main approaches have been developed. One consists in performing the bonding under ultrahigh vacuum after stripping of the thin tungsten layers from the surface by ion bombardment in order to remove its native oxide. Indeed, following this bombardment, dangling bonds are available and the metal-metal contact is then possible. However, this solution is very sensitive since it is carried out under ultrahigh vacuum, it therefore remains hardly marketable at an affordable cost.

Another method consists in the direct bonding of tungsten layers deposited by CVD («Chemical Vapor Deposition») after a mechanical and chemical polishing step, also known by CMP (Chemical Mechanical Polishing). Nevertheless, a drawback of such a method lies in the fact that it requires the formation of an adhesion sub-layer for the germination and the formation of a stable tungsten layer by CVD deposition. This adhesion sub-layer, commonly made of TiN, causes a reduction in the vertical electrical conductivity of the assembly. Another drawback of such a method lies in the fact that the obtained bonding energy is low at ambient temperature. Only annealing temperatures of the bonding greater than 700° C. allow sealing the bonding, which cannot be used in the context of the 3D integration or other methods in which the substrates include temperature sensitive electronic components.

A solution described in the document FR1455848 has been recently developed in order to overcome the aforementioned drawbacks. This method consists in a deposition of a controlled tungsten oxide phase by reactive sputtering, that is to say by reactive sputtering by directly injecting gaseous dioxygen into an argon plasma initially established in the tungsten sputtering deposition chamber. By finely controlling the stoichiometry of the deposited tungsten oxide called passivation tungsten oxide, on a tungsten layer, it has been shown that the assembly of two tungsten layers was possible without defectivity at the bonding interface up to 1200° C., with a high mechanical strength, in particular compatible with the Smart Cut™ method, and a good vertical electric conduction. Here, it is meant by defectivity the creation of defects at the bonding interface with the post-bonding heat treatment of a diameter greater than 10 µm detectable by the SAM (Scanning Acoustic Microscopy) technique.

However, a crystallization reaction following a dendritic growth of these tungsten oxide layers to temperatures of 500° C. affects the integrity and the continuity of the layer and compromises their integration. FIG. 1 reproduces a scan carried out by AFM (Atomic Force Microscopy) on a field of 4 micrometers×4 micrometers of such a layer annealed for 2 hours. Crystals of significant size (brightest portion) are formed, the formation of these crystals may lead to generate voids in the material in the layer, making the vertical electric conduction locally impossible therethrough.

One of the aims of the present invention is thus to overcome at least one of these drawbacks. To this end, the present invention proposes a direct bonding method between a first substrate and a second substrate, in particular used in the microelectronics industry, the method comprising the steps of:

a) Providing the first substrate and the second substrate, b) Forming a first bonding layer comprising tungsten oxide on the first substrate and a second bonding layer comprising tungsten oxide on the second substrate, at least one of the first bonding layer and of the second bonding layer including a third element M so as to form an MWxOy-type alloy, the atomic content of M in the composition being comprised between 0.5 and 20% and preferably comprised between 1 and 10%, c) Carrying out the direct bonding between the first bonding layer and the second bonding layer, and d) Performing a heat treatment at a temperature greater than 250° C., and advantageously at a temperature comprised between about 400 and 600° C.

Thanks to this configuration, the generally unstable tungsten oxide is stabilized by the provision of a third element M forming a temperature-resistant alloy. Thus, the integrity of the first bonding layer and the second bonding layer resists to the heat treatment serving to increase the bonding energy between the first and the second substrates. No discontinuity appears in said layers. Thus, the two substrates are bonded by an electrical conductor direct bonding thanks to the vertical electric conduction ensured by the bonding layers. The absence of a gap in the bonding layer, as compared to the previously described methods, allows making reliable connections, even from small-sized (50 nm) tungsten connectors (plugs). Furthermore, the temperature of the bonding annealing heat treatment is low such that the possible electronic components on the substrates are preserved.

Advantageously from 250° C., the heat treatment of step c) provides a bonding reinforcement sufficient to achieve a level of adhesion compatible with a mechanical thinning or a low temperature Smart Cut™ method, in particular obtained by co-implantation of ionic species.

A consolidation temperature comprised between 400 and 600° C. allows accessing to a level of adhesion compatible with Smart Cut™ «classic» conditions (an implanted ionic species, fracture temperature around 500° C.).

The term «direct bonding» means in the present document the contacting of two surfaces sufficiently smooth and clean in order to create an adherence therebetween, without providing an adhesive material between the two surfaces.

Moreover, the term «substrate» may also designate a massive or composite wafer, as well as a chip. A direct bonding method such as the one described above may be applied not only to a direct bonding between two substrates, whether or not comprising electronic devices, but also to a direct bonding between a substrate and a chip or to a direct bonding between two chips.

The temperature of the heat treatment being less than 600° C., this method is compatible with the presence of a CMOS component in the first substrate.

Preferably, step b) is carried out so as to form a MWxOy-type alloy with an atomic content of the third element M comprised between about 0.5 and 20%. It is understood that the third element M may be present in an oxidized form in the alloy.

Advantageously, the direct bonding according to step b) of the present invention is carried out by contacting the bonding layers at ambient temperature.

The direct bonding according to step b) is also carried out at atmospheric pressure.

The bonding method of the present invention is thus easy to implement and inexpensive. It is not even necessary to apply a uniaxial pressure on either side of the assembly formed of the first substrate bonded to the second substrate in order to reinforce the bonding energy.

According to an arrangement, the third element M is selected from the elements of the lines 1 to 6 and the columns 1 to 17 of the periodic table.

Advantageously, the third element M is selected from the transition metals and the combination thereof, so as to promote the electric conductivity within the tungsten oxide. Thus, the vertical electric conduction between the first substrate and the second substrate is improved.

Preferably, the third element M is selected from Ti, Y, V, Cr, Mn, Fe, Co, Ni, Cu, Zn, Mo, Ru, Pd, Ag, Hf, Ta, Ir, Pt and Au and the combination thereof, so as to form an alloy compatible with a use in microelectronics. These materials are electrical conductors and are unlikely to contaminate the materials of the substrates or damage the electronic components.

According to a possibility, the third element M is an oxidized element among the aforementioned elements.

In the present application, the term "electronic components" means both complex components such as CMOS, memories, and simple components such as an electrical interconnection. The electronic components may be made prior to the direct bonding by microelectronic methods including in a non-exhaustive manner etching, deposition, cleaning steps or others.

According to an arrangement, the first bonding layer and the second bonding layer have independently of each other a thickness comprised between about 5 and 50 nanometers.

According to a possibility, the formation of the first bonding layer and the second bonding layer according to step b) comprises the formation of a tungsten oxide followed by the incorporation of the third element M to the tungsten oxide.

Typically, the formation of the tungsten oxide comprises a chemical deposition, such as by CVD.

According to a variant, the formation of the tungsten oxide comprises a native oxidation, dry oxidation or wet oxidation of a superficial region of a first tungsten layer and a second tungsten layer respectively previously formed on the first substrate and the second substrate respectively.

According to a possibility, the third element M is incorporated to the tungsten oxide by ion diffusion.

According to a variant, the third element M is incorporated to the tungsten oxide by ion implantation.

According to another variant, the at least one of the first bonding layer and of the second bonding layer including the third element M is formed by depositing by a reactive co-sputtering of tungsten and of the third element M, under a plasma comprising a determined amount of gaseous oxygen. The term «reactive co-sputtering» means in the present document a simultaneous sputtering of two elements under a plasma comprising a reactive species, that is to say reacting with at least one of the two sputtered elements. Thus, this PVD (Physical Vapor Deposition) deposition alternative allows the simultaneous formation of the alloy of the tungsten oxide and of the third element M.

According to a possibility, the reactive co-sputtering is performed from a tungsten target and a third element M target.

According to another possibility, the deposition is performed by a reactive co-sputtering from a single target comprising an alloy formed of tungsten and of the third element M, the atomic content of the third element M of said alloy of the target being comprised between about 0.5 and 20%.

According to an arrangement, the reactive co-sputtering is performed with a surface power density applied on the tungsten target which is constant at about 2.6 W/cm2 in RF mode.

Advantageously, the inert gas used in the working gas plasma is argon provided with a flow rate of 50 sccm. Possibly, the inert gas may be xenon.

Preferably, the reactive gas is oxygen and the oxygen flow rate is comprised between 5 and 20 sccm and preferably between 8 and 13 sccm.

The third element M is advantageously molybdenum, in particular oxidized in the presence of the gaseous oxygen in the argon plasma.

Plasma is indeed obtained from argon and reactive oxygen, the oxygen and argon relative flow rate is adjusted to control the amount of oxygen in the alloy.

Preferably, the respective powers applied to the molybdenum and tungsten targets are adjusted such that the molybdenum atomic content in the alloy is comprised between 1 and 10%: for this, conditions should be chosen, leading substantially to the same deposition rate for the deposition of the tungsten oxide (3.36 Å/s for an Alliance Concept CT200 machine) and the deposition of the layer obtained by MoWxOy co-sputtering (comprised between 3.39 Å/s and 3.73 Å/s for this same machine, the power surface density range applied to molybdenum being comprised between about 0.1 and 0.8 W/cm$^2$). Indeed, this range of atomic content allows stabilizing effectively the alloy of the bonding layer, in particular during the stabilization annealing.

According to an arrangement, the method comprises, before step b), a step a1) of depositing by sputtering a first tungsten layer and a second tungsten layer respectively on the first substrate and the second substrate, step b) of depositing by reactive co-sputtering the first bonding layer and the second bonding layer being performed respectively on the first tungsten layer and the second tungsten layer in the same enclosure as the PVD deposition of step a1), the method being devoid of any intermediate re-venting step between step a1) and step b). Thus, the bonding obtained between the first substrate and the second substrate is stable and the presence of the tungsten layers devoid of native oxide, guarantees a very good vertical electric conduction, which is ideal for 3D integrations.

Preferably, the first bonding layer and the second bonding layer comprise the third element M. Thus, the quality of the direct bonding is optimized as well as the electric conduction and the mechanical strength thereof.

Other aspects, aims and advantages of the present invention will appear better upon reading the following description of an embodiment thereof, given by way of non-limiting example and made with reference to the appended drawings. The figures do not necessarily respect the scale of all the shown elements so as to improve their readability. In the remainder of the description, for the sake of simplification, identical, similar or equivalent elements of the different embodiments have the same numerical references.

FIGS. 2 to 5 show successive steps of a direct bonding method by formation of a bonding layer comprising tungsten oxide comprising a third element, which may be called «impurity», with an atomic content comprised between 0.5% and 20%.

Figure 2:
FIGS. 2 to 5 illustrate successive steps, according to a sectional view, of a direct bonding method according to the invention.

A first silicon substrate 1 and a second silicon substrate 2 are firstly provided after a prior chemical cleaning of the surfaces by the CARO and RCA acid (step a)—FIG. 2).

Figure 3:
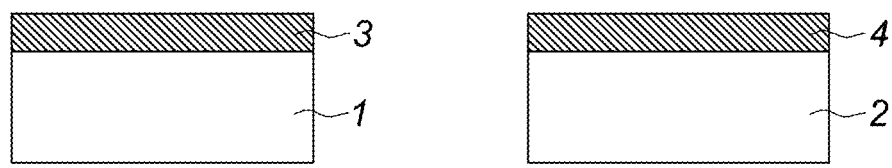

Then according to step a1) a first thin tungsten layer 3 (metal layer) and a second thin tungsten layer 4 (metal layer) are formed by PVD respectively on the first substrate 1 and the second substrate 2 (FIG. 3). The deposition of tungsten is performed, for example, in an Alliance Concept CT200 deposition frame at a temperature of 30° C., under application on the tungsten target with a power of 2.6 W/cm$^2$ per surface unit, applied in a continuous mode DC. The plasma comprises argon, present with a pressure of 1.9 mTorr and an argon flow rate of 50 sccm. No bias voltage is applied to the substrate during the deposition. The thickness of the first thin tungsten layer 3 and the second thin tungsten layer 4 is of about 10 nm.

Figure 4:
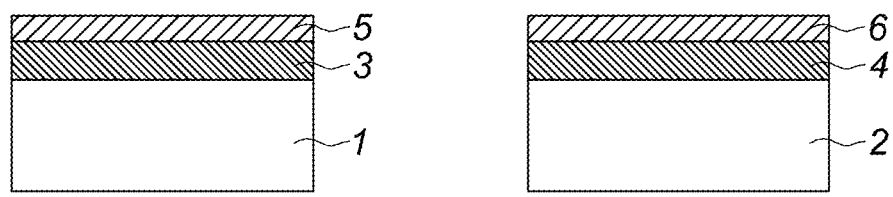

Following the step b) of the method, the formation of the first bonding layer 5 and the second bonding layer 6 respectively on the first thin tungsten layer 3 and the second thin tungsten layer 4 is carried out by reactive co-sputtering of tungsten and of the third molybdenum element by deposition in the same PVD frame, without intermediate re-venting step (that is to say without taking out the first and second substrates 1, 2 from the PVD equipment) in order to avoid the formation of native and unstable tungsten oxide at the surface of the conductor first and second thin tungsten layers 3, 4 (FIG. 4). In this case, dioxygen is incorporated into the argon working gas plasma used to deposit the tungsten layer by opening a dioxygen inlet valve to supply dioxygen to the working gas plasma. The first bonding layer 5 and the second bonding layer 6 of MoWxOy are formed with a thickness of 5 nanometers each, according to the following parameters:

The deposition temperature is in the order of 30° C., no bias voltage is applied to the substrate.

The source comprises two targets. A tungsten target on which the applied power is kept constant at 2.6 W/cm$^2$ in RF mode, and a Molybdenum target on which a power of 0.4 W/cm$^2$ in RF mode is applied so as to obtain deposition rates such that the atomic Molybdenum content in the composition of the alloy is 5%.

The pressure in the deposition chamber is of 1.9 mTorr, the argon flow rate is of 50 sccm and the gaseous oxygen flow rate is of 8.8 sccm.

According to a non-illustrated variant, the source is composed of a single target comprising directly a tungsten and molybdenum alloy, present with an atomic content of 5%. Under these conditions, the deposition of the first bonding layer 5 and the second bonding layer 6 is performed by a single reactive sputtering in the presence of oxygen.

Figure 5:
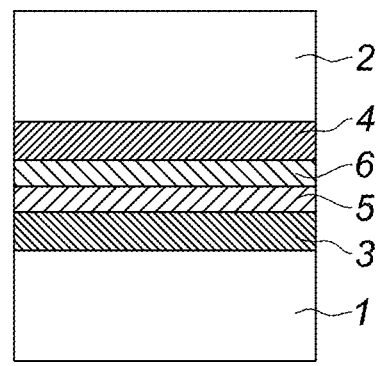

Then, the first bonding layer 5 and the second bonding layer 6 are contacted for a direct bonding according to step c) of the method and a bonding annealing is performed by the application of a heat treatment made at 500° C. for a duration of 2 hours according to step d). This annealing allows a mechanically stable assembly between the first substrate 1 and the second substrate 2 (FIG. 5). No application of pressure on either side of the bonding interface is necessary to enhance the energy of the bonding.

Figure 1:
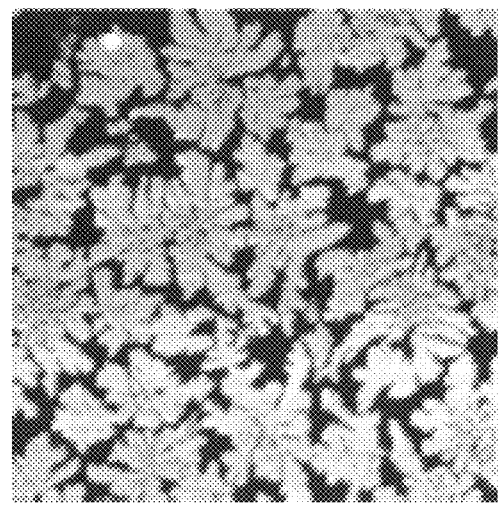
FIG. 1 is a reproduction of an AFM scan of an annealed bonding layer of the prior art on a field of 4 micrometers×4 micrometers illustrating a dendritic crystallization of the tungsten oxide.
Figure 6:
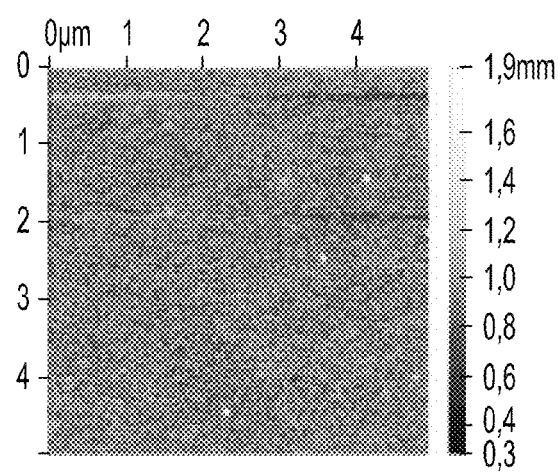
FIG. 6 is a reproduction of an AFM scan of a bonding layer obtained according to the invention over a field of 5 micrometers×5 micrometers.

A mechanical and chemical thinning is carried out until reaching the first and second bonding layers 5,6 made of MoWxOy for observation purposes. The morphology of these first and second bonding layers 5, 6 is observed by atomic force microscope (AFM) by using the «tapping» mode. It is shown on the scan of FIG. 6. The first and second bonding layers 5, 6 made of MoWxOy comprising an atomic molybdenum content of 5% is continuous and does not have crystallized regions, unlike the bonding layer of the prior art and having no third element (referring to the scan reproduced in FIG. 1). Thus, the method of the invention allows obtaining homogeneous first and second bonding layers 5, 6 allowing to ensure the vertical electric conduction between the two assembled substrates 1, 2.

According to a variant, the method of the invention is carried out with a heat treatment at 600° C. for two hours and leads to the same observation, that the estimated atomic molybdenum content of the first and second bonding layers 5, 6 is of 2%, 5% or 10% (not illustrated).

The same results are obtained with different oxygen flow rates. However, beyond 12.5 sccm flow rate, the molybdenum content is preferably greater than 2% in order to avoid any risk of crystallization if the bonding reinforcing heat treatment is performed at more than 550° C.

According to a non-illustrated alternative, the bonding of the first substrate 1 and the second substrate 2 is also made from first and second bonding layers 5, 6 initially formed of tungsten oxide and in which a third element is incorporated by implantation or by ion diffusion before contacting.

The third element is selected according to the desired properties of the bonding and according to the target applications. It is for example selected from the list of the transition metals in order to promote the vertical electric conduction. It is advantageously selected from the list of Ti, Y, V, Cr, Mn, Fe, Co, Ni, Cu, Zn, Mo, Ru, Pd, Ag, Hf, Ta, Ir, Pt and Au and the combination thereof, to avoid the risk of contaminating the applications in the field of microelectronics.

According to another non-illustrated arrangement, the first substrate 1 and the second substrate 2 are constituted of materials of different natures and chosen from semiconductor materials, metals or ceramics, covered or not with a thin metal layer or a patterned dielectric.

Thus, the present invention proposes an electrical conductor bonding method with a good mechanical strength despite a bonding annealing performed at a temperature compatible with the presence of electronic components. Indeed, the presence of a third element or an «impurity» in the material of the first and second bonding layers 5, 6 comprising tungsten oxide allows stabilizing the layer and delaying the crystallization thereof, which limits the electric conduction of the bonding interface and limits the strength of the bonding. Furthermore, the method is simple to implement, inexpensive and fast, the incorporation of the third element may be performed simultaneously with the deposition of the first and second bonding layers 5, 6.

It goes without saying that the invention is not limited to the embodiment described above by way of example but that it comprises all technical equivalents and variants of the described means and the combinations thereof.

The invention claimed is:

1. A method of direct bonding between a first substrate and a second substrate, the method comprising the steps of:
   a) Providing the first substrate and the second substrate,
   b) Forming a first bonding layer comprising tungsten oxide on the first substrate and a second bonding layer comprising tungsten oxide on the second substrate, at least one of the first bonding layer and of the second bonding layer including a third element M so as to form an MWxOy-type alloy, the atomic content of M in the composition of the alloy being comprised between 0.5 and 20%,
   c) Carrying out the direct bonding between the first bonding layer and the second bonding layer, and
   d) Performing a heat treatment at a temperature greater than 250° C.

2. The method according to claim 1, wherein the heat treatment is performed at a temperature comprised between 400° C. and 600° C.

3. The method according to claim 1, wherein the third element M is selected from the transition metals and the combination thereof, so as to promote the electric conduction between the first substrate and the second substrate.

4. The method according to claim 1, wherein the third element M is selected from Ti, Y, V, Cr, Mn, Fe, Co, Ni, Cu, Zn, Mo, Ru, Pd, Ag, Hf, Ta, Ir, Pt and Au and the combination thereof, so as to form an alloy compatible with a use in microelectronics.

5. The method according to claim 1, wherein the first bonding layer and the second bonding layer have independently of each other a thickness comprised between about 5 and 50 nanometers.

6. The method according to claim 1, wherein the formation of the first bonding layer and the second bonding layer according to step b) comprises the formation of a tungsten oxide followed by the incorporation of the third element M to the tungsten oxide.

7. The method according to claim 6, wherein the third element M is incorporated to the tungsten oxide by ion diffusion.

8. The method according to claim 6, wherein the third element M is incorporated to the tungsten oxide by ion implantation.

9. The method according to claim 1, wherein the at least one of the first bonding layer and of the second bonding layer including the third element M is formed by depositing by a reactive co-spray of tungsten and of the third element M, under a plasma comprising a determined amount of gaseous oxygen.

10. The method according to claim 9, wherein the reactive co-spray is performed from a tungsten target and a third element M target.

11. The method according to claim 9, wherein the deposition is performed from a single target comprising an alloy formed of tungsten and of the third element M, the atomic content of the third element M of said alloy of the target being comprised between about 0.5 and 20%.

12. The method according to claim 9, wherein the third element M is molybdenum oxidized by the gaseous oxygen present in the plasma.

13. The method according to claim 12, wherein the respective rates of molybdenum and tungsten deposition are adjusted so that the atomic molybdenum content in the composition of the alloy is comprised between 1 and 10%.

14. The method according to claim 1, comprising before step b), a step a1) of depositing by spray a first thin tungsten layer and a second thin tungsten layer respectively on the first substrate and the second substrate and wherein step b) of depositing by co-spray the first bonding layer and the second bonding layer is performed respectively on the first thin tungsten layer and the second thin tungsten layer in the same enclosure as the deposition of step a1), the method being devoid of any intermediate re-venting step between step a1) and step b).

15. The method according to any of claim 1, wherein the first bonding layer and the second bonding layer comprise the third element M.

* * * * *